United States Patent [19]

Tanaka

[11] Patent Number: 5,105,431
[45] Date of Patent: Apr. 14, 1992

[54] SEMICONDUCTOR LASER

[75] Inventor: Akira Tanaka, Yokohama, Japan

[73] Assignee: Kabushiki Kaisha Toshiba, Kawasaki, Japan

[21] Appl. No.: 668,888

[22] Filed: Mar. 13, 1991

[30] Foreign Application Priority Data

Mar. 16, 1990 [JP] Japan ................................. 2-66686

[51] Int. Cl.⁵ .............................................. H01S 3/19
[52] U.S. Cl. ........................................ 372/46; 372/96
[58] Field of Search .............................. 372/96, 46, 45

[56] References Cited

U.S. PATENT DOCUMENTS 4,807,245 2/1989 Hirata et al. ............................ 372/96
4,837,775 6/1989 Andrews et al. ...................... 372/96

FOREIGN PATENT DOCUMENTS 60-177302 9/1985 Japan .
62-169388 7/1987 Japan .

Primary Examiner—James W. Davie
Attorney, Agent, or Firm—Finnegan, Henderson, Farabow, Garrett, and Dunner

[57] ABSTRACT

A semiconductor laser comprises a grating which has concavities and convexities and which extends in a longitudinal direction of laser stripes including an optical waveguide layer and an active layer. The sides of the active layer extending in a waveguiding direction have convex and concave portions alternately arranged at regular intervals, so that a current passing through the active layer differs, depending on the locations thereof. The concave portions of the active layer are arranged at the same intervals as those between the convexities of the grating. The concave portions of the active layer are located in positions corresponding to the convexities of the grating, and the convex portions of the active layer are located in positions corresponding to the concavities of the grating. Hence, not only the index of the refraction by the grating, but also the laser gain, can differ, depending on the locations of the active layer, since the sides of the active layer have the convex and concave portions alternately arranged at regular intervals. Thus, stable single-longitudinal mode oscillation can be obtained.

14 Claims, 3 Drawing Sheets

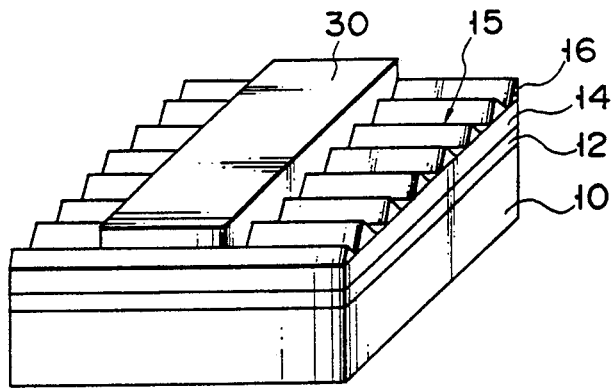
F I G. 2A
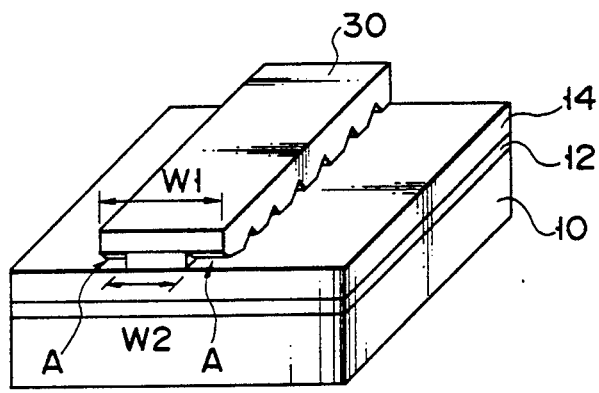
F I G. 2B
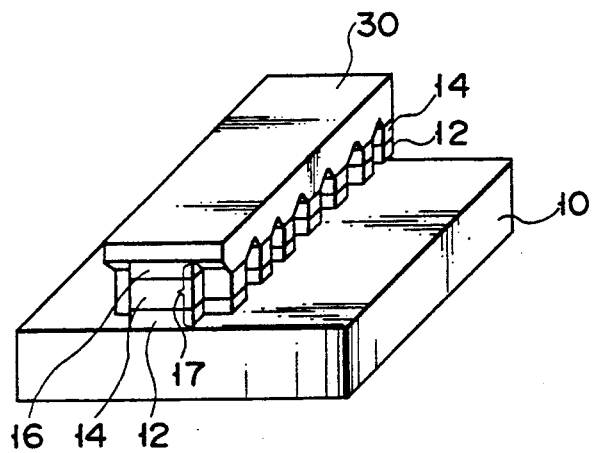
F I G. 2C

SEMICONDUCTOR LASER

BACKGROUND OF THE INVENTION

1. Field of the Invention

This invention relates to a semiconductor laser, and more particularly to a semiconductor laser having a rugged grating which extends in the longitudinal direction of a laser stripe including an optical waveguide and an active layer.

2. Description of the Related Art

A semiconductor laser which oscillates in a single-longitudinal mode is known as a light source for a mass optical communication. Conventionally, a distributed feedback (DFB) semiconductor leaser has been used, which has an optical waveguide including a grating for distributing and feeding back light to the top or bottom portion of an active layer. A type of the distributed feedback laser has laser stripe constituted by an optical waveguide layer including a grating, an active layer, and a cladding layer. Whether the distributed feedback laser oscillates in a single-longitudinal mode or not depends on the phase of the grating at the end face of the laser stripe. To increase the probability of single-longitudinal mode oscillation, it is necessary to control the shape of the grating.

Usually, a grating is formed by wet-etching. In a semiconductor laser for optical communication, which generates a beam of a wavelength of 1.3 μm or 1.55 μm, convexities of the one-dimensional grating are arranged at intervals of 2000 to 2400Å, and the height of each convexity is, at most, several hundreds of Å. Hence, it is very difficult to control the shape of the rating by wet etching.

Further, to increase the probability of single-longitudinal mode oscillation, there has been proposed a structure in which the phase of the grating is shifted at the middle of the laser stripe. However, since a complicated process is required to manufacture this structure, it is also difficult to control the shape of the grating.

SUMMARY OF THE INVENTION

The present invention has been made in consideration of the above-described circumstances, and its object is to provide a semiconductor laser which comprises a rugged grating extending in the longitudinal direction of a laser stripe including an optical waveguide layer, and an active layer and which oscillates in a single-longitudinal mode in high probability, and a method for manufacturing the same.

In the semiconductor laser of the present invention, that side of the active layer which extends in a waveguiding direction has convex and concave portions alternately arranged at regular intervals, so that current passing through the active layer differs, depending on the locations thereof.

In a preferred embodiment of the invention, the sides of the active layer which extend in a waveguiding direction have the convex and concave portions. The interval is an integer number of times, desirably the same as that of the interval between convexities of the grating. The convex and concave portions of the active layer are respectively arranged in positions corresponding to the concavities and the convexities of the grating.

By virtue of the above-described semiconductor laser, not only the real number portion of the index of refraction, i.e., the index of the refraction by the grating, but also the imaginary number portion thereof, i.e., the laser gain, can differ at the interval, since a side of the active layer has the convex and concave portions alternately arranged at the regular intervals. Thus, stable single-longitudinal mode oscillation can be obtained.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention and together with the general description given above and the detailed description of the preferred embodiment given below, serve to explain the principles of the invention.

FIGS. 2A, 2B, 2C, 2D, and 2E are perspective views showing in sequence the steps of manufacturing the semiconductor laser shown in FIG. 1.

DETAILED DESCRIPTION OF THE PREFERRED EMBODIMENTS

Figure 1:
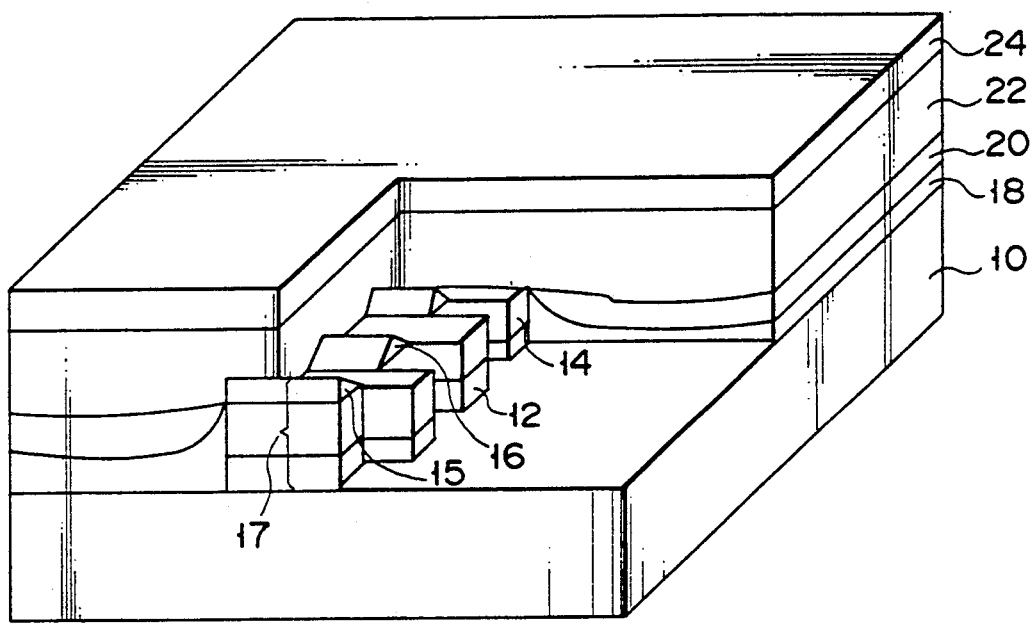
FIG. 1 is a perspective view showing a semiconductor laser of an embedded type according to an embodiment of the present invention.

As shown in FIG. I, the semiconductor laser of the present invention comprises laser stripe 17 formed on an n-type InP substrate 10. The laser stripe 17 is constituted by an undoped InGaAsP active layer 12, a p-type InP cladding layer 14, and an n-type InGaAs optical waveguide layer 16 including a grating 15. The sides of the active layer 12 have convex and concave portions alternately arranged at regular intervals. The laser stripe including the active layer 12, which has rugged sides, is surrounded by and embedded in a p-type InP layer 18, an n-type Inp layer 20, a p-type InP layer 22, and a p-type InGaAsP ohmic layer 24.

The optical waveguide layer 16, which includes the rating 15 having convexities arranged at regular intervals, is of a conductivity type opposite to that of the cladding layer 14. The sides of the active layer 12 formed under the grating 15 have convex and concave portions alternately arranged at the same intervals as those in the grating 15. In this embodiment, as is shown in FIG. 1, the convexities of the rating 15 are located on the concave portions of the active layer 12 (the narrow portions of the active layer from the top view). and the concavities of the rating 15 are located on the convex portions of the active layer 12 (the wide portions of the active layer from the top view).

Since the sides of the active layer 12, as well as the grating 15, have convex and concave portions alternately formed at the regular intervals, current introduced into the active layer 12 can be different from each adjacent portion of the active layer. In other words, since the active layer 12 has narrow portions and wide portions formed in a cyclically repeated fashion, the current passing through the active layer 12 differs depending on locations of the layer 12, thereby obtaining a distributed gain effect and a stable oscillation in a longitudinal mode.

The interval between convex portions formed on the sides of the active layer 12 need not be the same as that between the convexities of the grating 15, but can be an integer number of times greater than that. Alternatively, the interval between the convexities of the grating 15 can be an integer number of times greater than that between the convex portions formed on the sides of the active layer 12.

A method of manufacturing the above-mentioned distributed feed back semiconductor laser will be described with reference to FIGS. 2A to 2E. In FIGS. 2A to 2E, the elements shown in FIG. 1 are identified with the same reference numerals as in FIG. 1.

First, as shown in FIG. 2A, an undoped InP active layer 12, a p-type cladding layer 14 and an n-type InGaAsP optical waveguide layer 16 are deposited in this order on an n-type InP substrate 10. Sequentially, a primary grating 15 is formed in the optical waveguide layer 16 by, for example, the two-beam interference exposure, such that the concavities of the grating 15 reach the cladding layer 14. As a result, the optical waveguide 16 is separated in a cyclically repeated fashion, i.e., optical waveguide bars are arranged at regular intervals. The interval is about 2000Å in a laser which generates a beam having a wavelength of 1.3 μm, and about 2400Å in a laser which generates a beam having a wavelength of 1.55 μm. Then, an SiO$_2$ film is formed entirely on the optical waveguide layer 16 by, for example, a CVD method. The SiO$_2$ film is patterned by, for example, a photolithographic etching method such that an SiO$_2$ film mask 30 perpendicularly crosses the concavities of the grating 15.

Next, as shown in FIG. 2B, exposed portions of the bars in the optical waveguide layer 16 are etched by an etchant containing sulfuric acid, using the SiO$_2$ film mask 30 as a barrier against etching. At this time, side etching is performed with respect to portions A under the mask 30. The amount of the side etching can be easily controlled by changing the etching period or the like. In other words, the ratio of a width W2 of the bars in the optical waveguide layer 16 to a width W1 of the mask 30 can be easily changed.

Next, as shown in FIG. 2C, the cladding layer 14 and the active layer 12 are partially etched in sequence by, for example, an etchant containing hydrochloric acid and an etchant containing sulfuric acid, respectively, using the SiO$_2$ film mask 30 as a barrier against etching. As a result, convex and concave portions are alternately formed on the sides of the laser stripe 17 including the active layer 12 at the same intervals as in the grating 15.

Figure 2D:
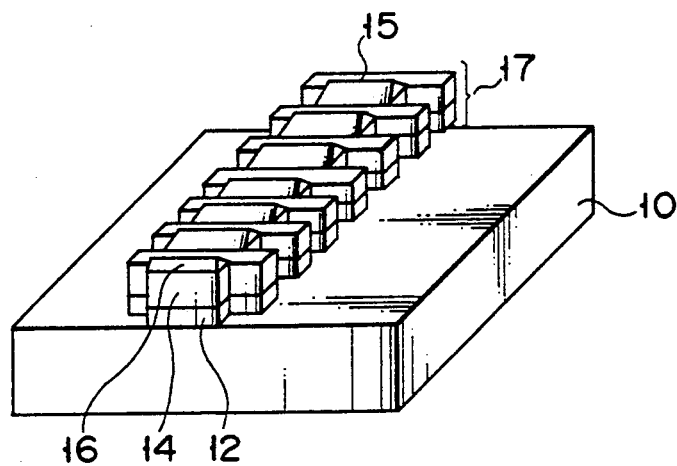

Then, as shown in FIG. 2D, the SiO$_2$ film mask 30 is removed, with the result that the substantially entire laser stripe 17 is exposed.

Figure 2E:
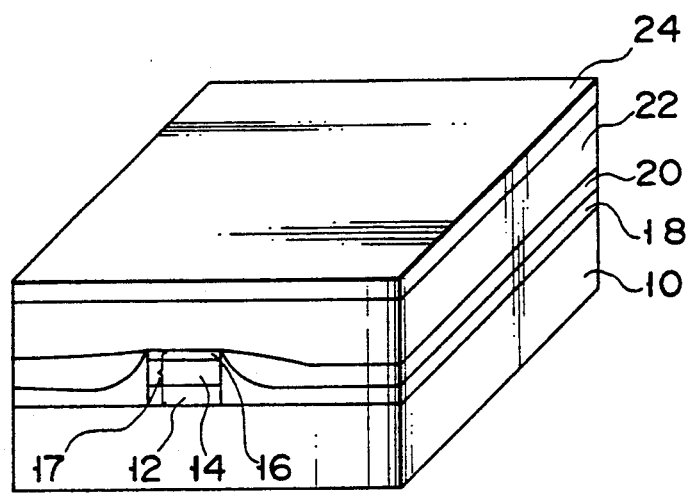

Thereafter, as shown in FIG. 2E, a p-type InP layer 18, an n-type InP layer 20, a p-type InP layer 22, and a p-type InGaAsP layer 24 are formed in sequence on the entire substrate, thereby enclosing the laser stripe 17.

With the above-described steps, a crystal growth process for manufacturing a distributed feedback semiconductor laser of an embedded type according to the embodiment of the invention is completed.

In the method as described above, the concave portions of the active layer 12 are formed in a self-aligning manner corresponding to the bars formed at the predetermined intervals in the optical waveguide layer 16.

Moreover, the configuration of the convex and concave portions of the active layer 12 can be easily changed by suitably controlling the amount of side etching.

Although the embodiment has been described as an example of the semiconductor laser of an embedded type, the present invention is not limited to this embodiment, but can be applied to any semiconductor laser that has a grating, with the same effect as in the above-described embodiment.

In addition, the semiconductor laser having a grating includes not only a distributed feedback laser (DFB laser), but also a distributed refraction laser (DBR laser).

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A semiconductor laser comprising:
   a laser stripe including an optical waveguide layer, an active layer, and a pair of cladding layers between which the active layer is interposed; and
   a grating which has convexities and concavities, and which extends in a longitudinal direction of the laser stripe;
   wherein a side of the active layer extending in a waveguiding direction has convex and concave portions alternately arranged at regular intervals, so that when electrical current is passed through the active layer, the value of the electrical current differs at different regions of the active layer.

2. A semiconductor laser according to claim 1, wherein both sides of the active layer extending in a waveguiding direction have the convex and concave portions alternately arranged at the same regular intervals.

3. A semiconductor laser according to claim 2, wherein the interval between the concave portions of the active layer is an integer number of times that between the convexities of the grating.

4. A semiconductor laser according to claim 3, wherein the interval between the concave portions of the active layer is the same interval as that between the convexities of the grating.

5. A semiconductor laser according to claim 4, wherein the concave portions of the active layer are located in positions corresponding to the convexities of the grating, and the convex portions of the active layer are located in positions corresponding to the concavities of the grating.

6. A semiconductor laser according to claim 5, wherein the semiconductor laser is a distributed feedback laser.

7. A semiconductor laser according to claim 5, wherein the semiconductor laser is a distributed refraction laser.

8. A semiconductor laser comprising:
   (a) a laser stripe extending in a first direction and comprising;
   a first cladding layer of a first conductivity type;
   a second cladding layer of a second conductivity type;
   an active layer interposed between the first and second cladding layers; and
   an optical waveguide layer having a grating which consists of convexities and concavities oriented in a second direction perpendicular to the first direction, wherein the layers are stacked on each other in the second direction;

(b) a surrounding region in which the laser stripe is buried, except for both ends of the laser stripe in the first direction;

wherein a side of the active layer extending in the first direction has convex and concave portions oriented in a third direction perpendicular to the first and second directions, and alternatively arranged at regular intervals, so that when electrical current is passed between the first and second cladding layers through the active layer, the value of the electric current differs at different regions of the active layer.

9. A semiconductor laser according to claim 8, wherein both sides of the active layer extending in the first direction have the convex and concave portions alternately arranged at the same regular intervals.

10. A semiconductor laser according to claim 9, wherein the interval between the concave portions of the active layer is an integer number of times that between the convexities of the grating.

11. A semiconductor laser according to claim 10, wherein the interval between the concave portions of the active layer is the same interval as that between the convexities of the grating.

12. A semiconductor laser according to claim 11, wherein the concave portions of the active layer are located in positions corresponding to the convexities of the grating, and the convex portions of the active layer are located in positions corresponding to the concavities of the grating.

13. A semiconductor laser according to claim 12, wherein the semiconductor laser is a distributed feedback laser.

14. A semiconductor laser according to claim 12, wherein the semiconductor laser is a distributed refraction laser.

* * * * *

UNITED STATES PATENT AND TRADEMARK OFFICE
CERTIFICATE OF CORRECTION

PATENT NO. : 5,105,431
DATED : April 14, 1992
INVENTOR(S) : Akira TANAKA

It is certified that error appears in the above-identified patent and that said Letters Patent is hereby corrected as shown below:

Title page, item [57]
IN THE ABSTRACT:

Line 1, change "comprises" to --includes--.

Signed and Sealed this

Nineteenth Day of October, 1993

Attest:

BRUCE LEHMAN

*Attesting Officer*     Commissioner of Patents and Trademarks